(12) United States Patent
Azeyanagi et al.

(10) Patent No.: US 7,381,903 B2
(45) Date of Patent: Jun. 3, 2008

(54) PRINTED CIRCUIT BOARD AND INSPECTION METHOD THEREFOR

(75) Inventors: Kunihiko Azeyanagi, Tokyo-To (JP); Hideya Yoshikawa, Tokyo-To (JP); Hiroaki Inose, Tokyo-To (JP)

(73) Assignee: Nippon Mektron, Ltd., Tokyo-To (JP)

( * ) Notice: Subject to any disclaimer, the term of this patent is extended or adjusted under 35 U.S.C. 154(b) by 0 days.

(21) Appl. No.: 11/208,884

(22) Filed: Aug. 23, 2005

(65) Prior Publication Data

US 2006/0042822 A1    Mar. 2, 2006

(30) Foreign Application Priority Data

Aug. 27, 2004    (JP)    ............. 2004-248835

(51) Int. Cl.
  *H05K 1/00*    (2006.01)
  *H05K 1/09*    (2006.01)
(52) U.S. Cl. ........................ 174/257; 174/258
(58) Field of Classification Search ........ 174/255, 174/257, 258, 350; 361/816, 818
See application file for complete search history.

(56) References Cited

FOREIGN PATENT DOCUMENTS

| JP | 56-72365 | * | 6/1981 |
|---|---|---|---|
| JP | 60-78156 |  | 5/1985 |
| JP | 04-074489 |  | 3/1992 |
| JP | 05-021923 |  | 1/1993 |
| JP | 05283888 | * | 10/1993 |
| JP | 2001067077 | * | 3/2001 |
| JP | 2002-158413 |  | 5/2002 |

OTHER PUBLICATIONS

Definition of Target from answers.com.*

* cited by examiner

*Primary Examiner*—Hung V. Ngo
(74) *Attorney, Agent, or Firm*—Jacobson Holman PLLC

(57) ABSTRACT

It is an object of the present invention to provide a printed circuit board and an inspection method therefor capable of electrically inspecting misregistration of a solder resist and a display by silk printing with respect to a wiring pattern on a printed circuit board. The present invention provides a printed circuit board provided with a conductive layer for electromagnetic shielding including at least two targets 11, 12 formed as conductive patterns of the same shape on the printed circuit board, insulating layers 21, 22, 23, 4 greater than the targets and analogous to the targets provided in such a way as to be overlaid on the targets and an electromagnetic shielding layer 3 provided on the insulating layers, and an inspection method using the printed circuit board.

4 Claims, 4 Drawing Sheets

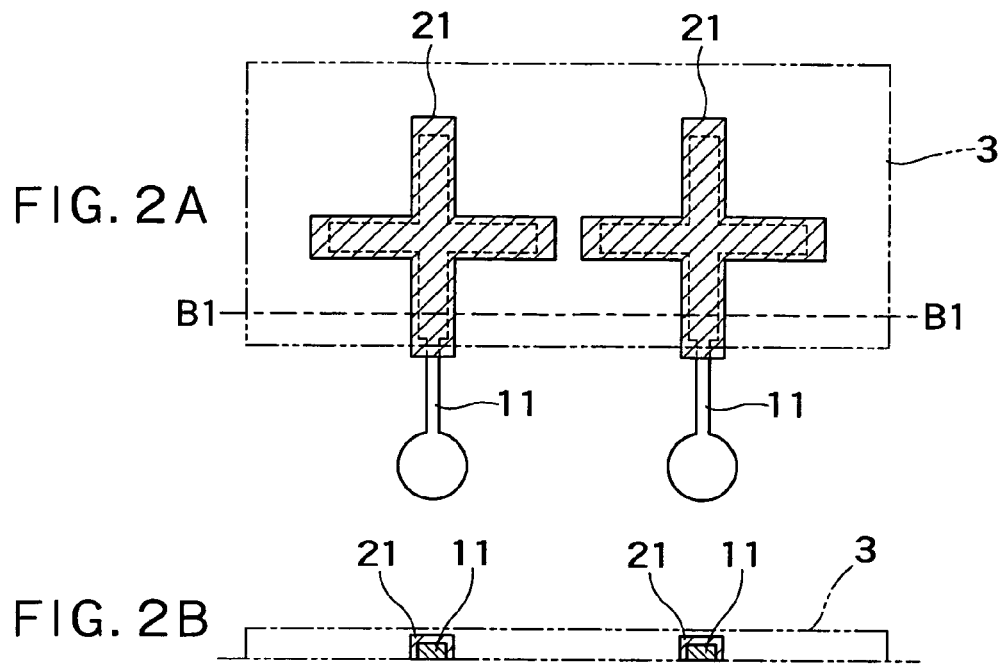
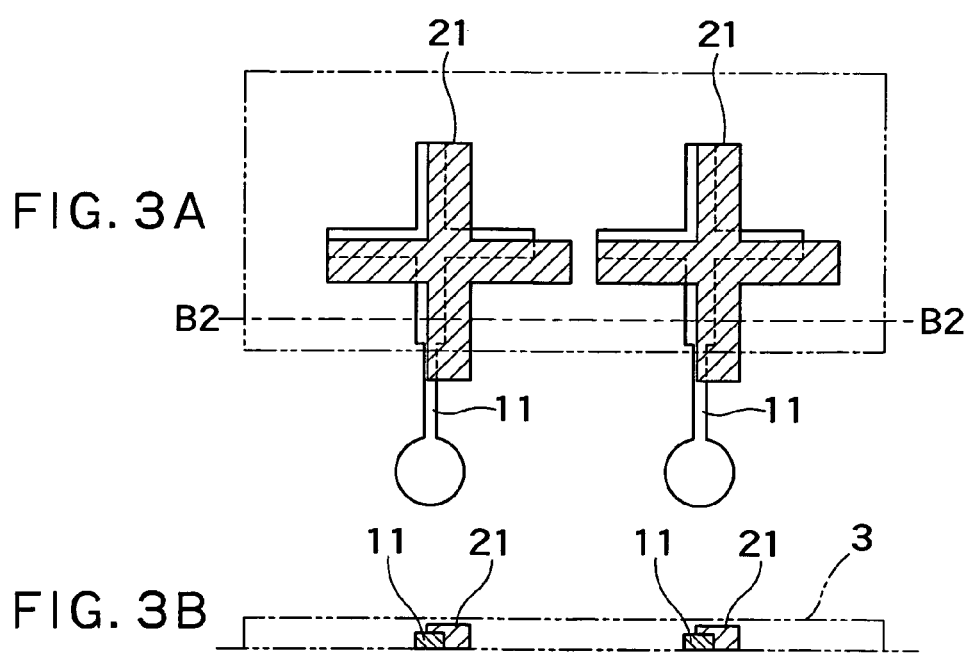

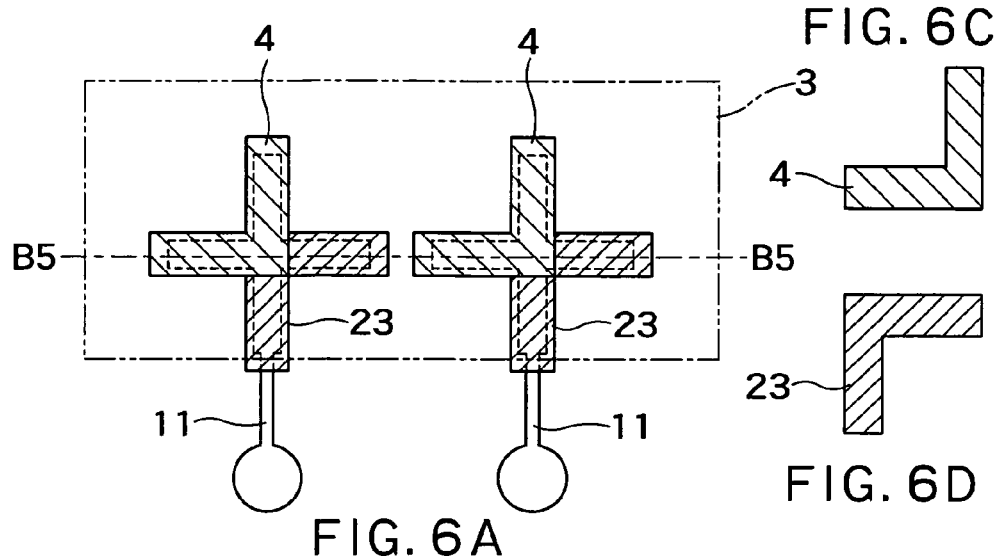
FIG. 6A
FIG. 6C
FIG. 6D
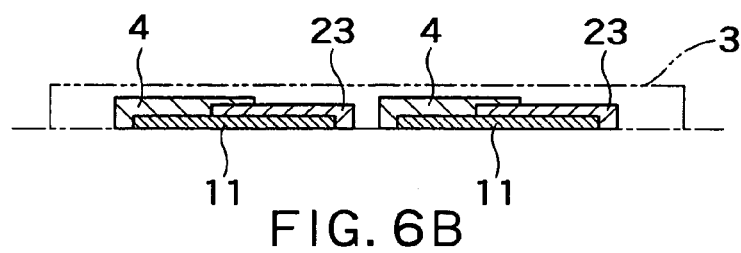
FIG. 6B
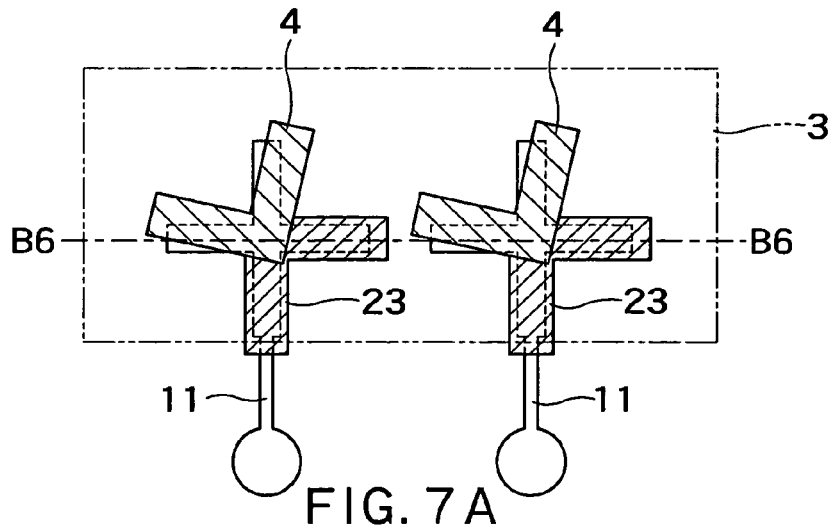
FIG. 7A
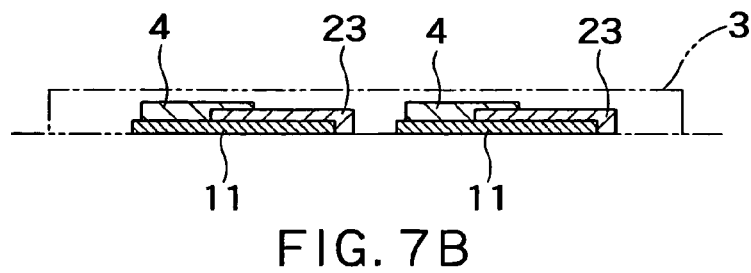
FIG. 7B

[//]: # (US 7,381,903 B2)

PRINTED CIRCUIT BOARD AND INSPECTION METHOD THEREFOR

BACKGROUND OF THE INVENTION

1. Field of the Invention

The present invention relates to a printed circuit board and an inspection method therefor, and more particularly, to a structure suitable for a misregistration inspection of each layer formed on a printed circuit board and an inspection method using the structure.

2. Related Art

A solder resist layer is generally formed on a printed circuit board for the purpose of protecting an outside wiring pattern. Moreover, display printing is applied to the solder resist layer for the purpose of identifying mounting parts.

Both the formation of the solder resist and display printing are performed using a silk screen printing method and printing is performed after conducting registration relative to an NC hole or a circuit pattern formed by etching. A solder resist is often formed by printing photosensitive resin ink, exposing the ink to light through a photomask and developing it.

In this case, misregistration of the solder resist and display printing with respect to a wiring pattern is inspected by observing misregistration check marks using a microscope (e.g., Japanese Utility Model Application Laid-Open No. 60-78156, Japanese Patent Publication No. 2926922).

Examples of electrical inspections are disclosed in Japanese Patent Application Laid-Open No. 5-21923 and Japanese Patent Application Laid-Open No. 2002-158413. Both documents disclose details of silk printing and show that it is possible to electrically inspect whether silk printing has caused misregistration on a wiring pattern or not.

In the case of Japanese Patent Application Laid-Open No. 5-21923, a dot-shaped or ring-shaped silk printing section with which an inspection jig probe (test pin) can come into contact is provided on a mounting pad to decide the presence/absence of misregistration depending on whether the probe contacts the pad or not.

However, the contact caused by a curvature of the probe itself may result in a detection error. A misregistration error of the solder resist is detected more rigorously than silk printing; misregistration of less than 0.1 mm may be regarded as an error and it is difficult to detect the misregistration error only using the probe.

Furthermore, in the case of Japanese Patent Application Laid-Open No. 2002-158413, a silk printing pattern is formed on a circular circuit pattern and exposure of any part of the circuit pattern when silk printing is shifted can be detected using a test pin.

It is also difficult to apply these technical contents to detection of a misregistration error in a solder resist. Another problem is that the test pin used must be of special shape.

In order to solve the above described problems, an object of the present invention is to provide a printed circuit board and an inspection method therefor capable of electrically inspecting display misregistration produced in a solder resist and silk printing with respect to a wiring pattern of the printed circuit board.

SUMMARY OF THE INVENTION

In order to attain the above described object, the present invention provides a printed circuit board having a conductive layer for electromagnetic shielding, comprising at least two targets formed as conductive patterns of the same shape on the printed circuit board, insulating layers greater than the targets and analogous to the targets provided in such a way as to be overlaid on the targets and an electromagnetic shielding layer provided on the insulating layers, and a method of inspecting a printed circuit board comprising the steps of forming at least two targets formed as conductive patterns of the same shape on the printed circuit board, forming insulating layers greater than the targets and analogous to the targets provided in such a way as to overlap with the targets, forming an electromagnetic shielding layer on the insulating layers and inspecting the presence/absence of misregistration between the targets and other layers depending on whether the targets are short-circuited by the electromagnetic shielding layer or not.

As described above, since the present invention forms the insulating layer greater than and analogous to the targets on the targets of the printed circuit board and forms the electromagnetic shielding layer overlaid thereon, when misregistration occurs between the targets and the insulating layer overlaid on the targets, the electromagnetic shielding layer short-circuits the targets, thus making it possible to detect the misregistration.

BRIEF DESCRIPTION OF THE DRAWINGS

FIGS. 2A, FIG. 2B are a plan view and a cross-sectional view along a line B1-B1 when the cross targets shown in FIG. 1A are used, illustrating a state in which the solder resist has caused no misregistration;

FIGS. 3A, FIG. 3B are a plan view and a cross-sectional view along a line B2-B2 when the cross targets shown in FIG. 1A are used, illustrating a state in which the solder resist has caused misregistration;

FIGS. 6A, FIG. 6B are a plan view and a cross-sectional view along a line B5-B5 when the cross targets shown in FIG. 1A are used, illustrating a state in which no misregistration is caused by the solder resist and silk printing, FIGS. 6C and 6D being plan views of the display by silk printing and the solder resist; and FIGS. 7A, FIG. 7B are a plan view and a cross-sectional view along a line B6-B6 when the circular targets shown in FIG. 1A are used, illustrating a state in which the solder resist has caused misregistration.

DETAILED DESCRIPTION OF THE INVENTION

Hereinafter, the present invention will be described more specifically with reference to the drawings.

First Embodiment

Figure 1A:
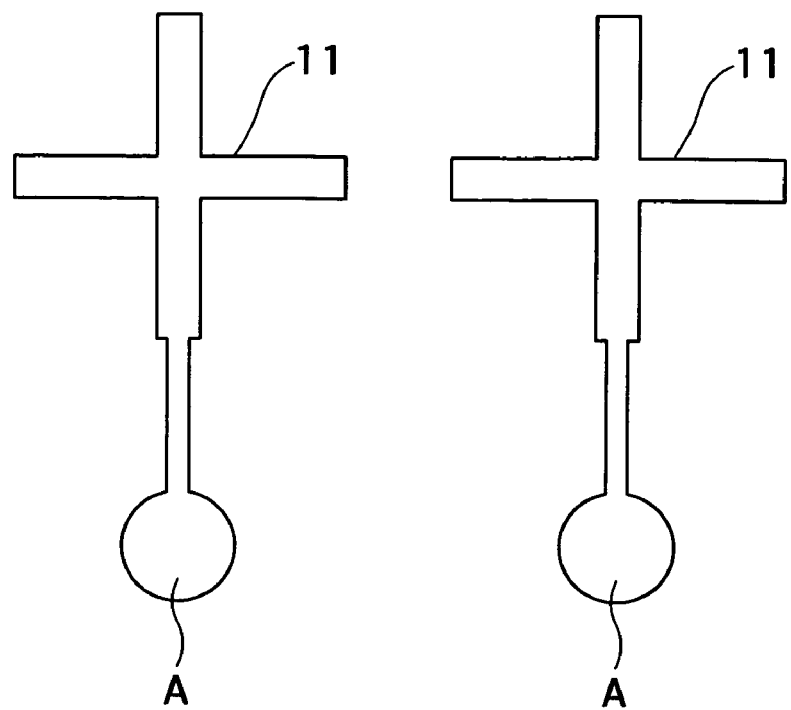
FIGS. 1A, FIG. 1B illustrate targets used for a printed circuit board according to the present invention.
Figure 1B:
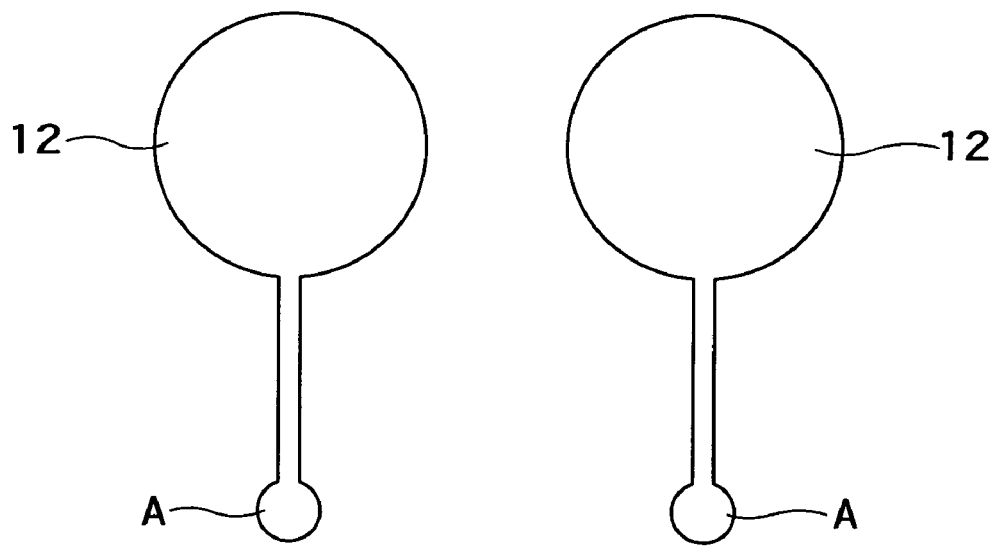

FIGS. 1A and 1B illustrate examples of targets formed on a printed circuit board (not shown); FIG. 1A shows a target 11 with a circular section A added to an end of a cross section and FIG. 1B shows a target 12 with a small circular section A added to an end of an extension of a circular section. Both targets are provided at one or more locations of the printed circuit board.

Both targets in FIGS. 1A and 1B are provided as a pair and both targets are used to detect misregistration of a solder resist or a display by silk printing with respect to the targets.

FIGS. 2A and 2B take a solder resist as an example and show a plan view and a cross-sectional view along a line B1-B1 of the targets in a state in which there is no misregistration of the solder resist. In this case, cross targets 11 are used.

Solder resists 21 are formed so as to be overlaid on the cross sections of the cross targets 11 and a conductive layer for electromagnetic shielding 3 is formed thereon.

Since the cross section of the target 11 and the cross section of the solder resist 21 are analogous and the solder resist 21 is greater than the target 11, when both overlap with each other without misregistration, the target 11 is covered completely with the solder resist 21.

Then, as shown in FIG. 2B, the target 11 is isolated from the conductive layer for electromagnetic shielding 3 by the solder resist 21. Therefore, the result of a test for continuity between the target 11 and the conductive layer for electromagnetic shielding 3 shows discontinuity, which indicates that the target 11 and the solder resist 21 are precisely aligned.

FIGS. 3A and 3B are a plan view and a cross-sectional view along a line B2-B2 when cross targets are used as in the case of FIG. 2 illustrating a state in which the solder resist 21 has caused misregistration with respect to the targets 11. Misregistration of the solder resist 21 toward the bottom right in the figure causes part of the target 11 to stick out of the contours of the solder resist 21. As a result, as shown in FIG. 3B, the target 11 directly contacts the conductive layer for electromagnetic shielding 3.

Therefore, when continuity between the target 11 and conductive layer for electromagnetic shielding 3 is tested, the results shows that both are continuous, which proves that the solder resist 21 has caused misregistration with respect to the target 11.

The allowable range of misregistration of the solder resist 21 with respect to the target 11 depends on the amount of excess in size of the solder resist 21 over the target 11.

Figure 4A:
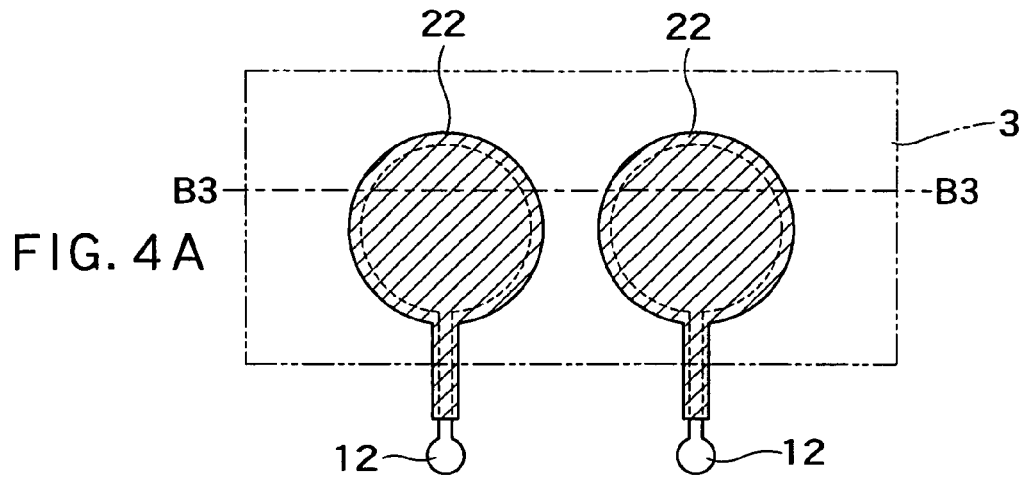
FIGS. 4A, FIG. 4B are a plan view and a cross-sectional view along the line B1-B1 when the circular targets shown in FIG. 1B are used, illustrating a state in which the solder resist has caused no misregistration.
Figure 4B:
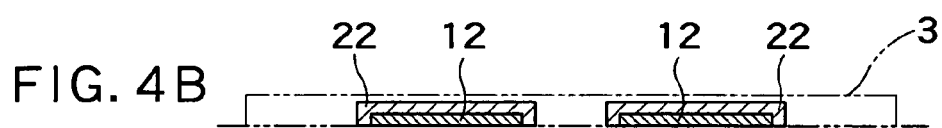

FIGS. 4A and 4B are a plan view and a cross-sectional view along a line B3-B3 illustrating a state in which the solder resist has caused no misregistration with respect to the circular target. In this case, since the solder resist 22 is interposed between the target 12 and the conductive layer for electromagnetic shielding 3, the target 12 is not continuous to the conductive layer for electromagnetic shielding 3.

Figure 5A:
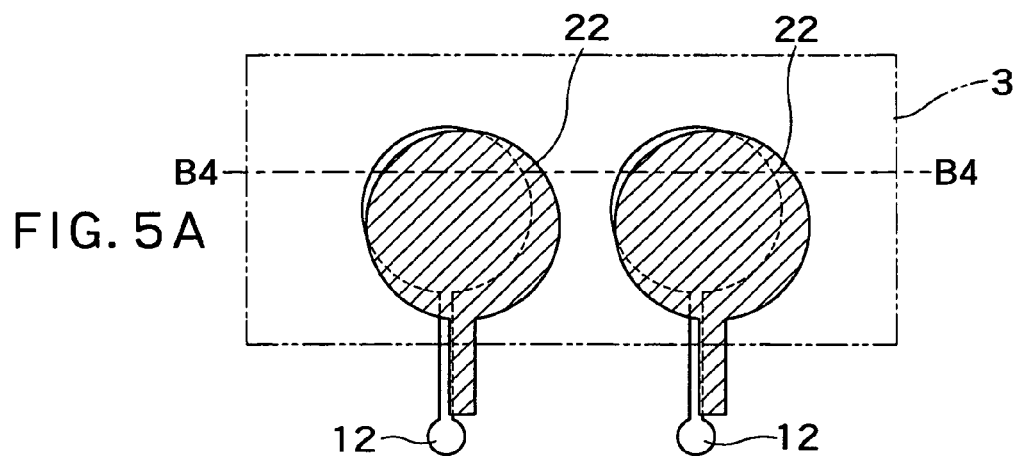
FIGS. 5A, FIG. 5B are a plan view and a cross-sectional view along the line B2-B2 when the circular targets shown in FIG. 1B are used, illustrating a state in which the solder resist has caused misregistration.
Figure 5B:
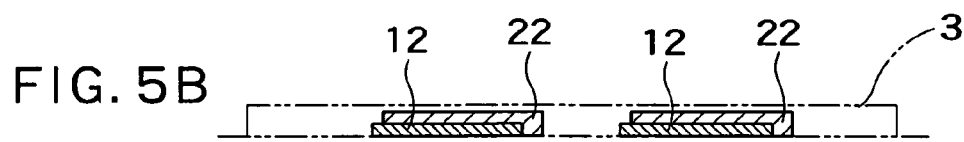

FIGS. 5A and 5B are also a plan view and a cross-sectional view along a line B4-B4 illustrating a state in which the solder resist has caused misregistration with respect to the circular target. Since the solder resist 22 is shifted toward the bottom right in FIG. 5A, the top left portion of the target 12 sticks out of the solder resist 22.

Therefore, the result of a test for continuity between the target 12 and the conductive layer for electromagnetic shielding 3 shows that there is continuity between the two.

When the solder resist 21 or 22 shown in FIG. 2 to FIG. 5 is replaced by a display by silk printing, it is possible to detect misregistration of this display in the same way.

FIGS. 6A, FIG. 6B are a plan view and a cross-sectional view along a line B5-B5 illustrating a state in which half of a solder resist 23 (FIG. 6D) and half of a display by silk printing 4 (FIG. 6C) are overlaid on the target 11 and both have caused no misregistration.

In this case, as shown in FIG. 6A, the bottom right portion of the target 11 in the figure is covered with the solder resist 23 and the top left portion is covered with the display by silk printing.

As a result, as shown in FIG. 6B, the target 11 is isolated from the conductive layer for electromagnetic shielding 3 by the solder resist 23 on the right side and by the display by silk printing 4 on the left side.

FIGS. 7A and 7B are a plan view and a cross-sectional view along a line B6-B6 illustrating a state in which, of the solder resist 23 and the display by silk printing 4 formed on the target 11 in the same way as in FIG. 6, the display 4 is tilted and printed causing misregistration with respect to the target 11.

In this case, as shown in FIG. 7B, the solder resist 23 is interposed between the target 11 and the conductive layer for electromagnetic shielding 3, but the display 4 cannot completely cover the target 11 and the target 11 directly contacts the conductive layer for electromagnetic shielding 3.

As a result, the target 11 is connected to the conductive layer for electromagnetic shielding 3. Therefore, the result of a test for continuity between the target 11 and the conductive layer for electromagnetic shielding 3 shows continuity between the two. This proves that there is misregistration between the target 11 and either the solder resist 23 or the display 4.

What is claimed is:

1. A printed circuit board having a conductive layer for electromagnetic shielding, comprising:
    at least two targets formed as conductive patterns of a same shape on said printed circuit board;
    insulating layers larger than said targets and analogous in shape in plan view to a portion of said targets and provided overlaid on said targets;
    an electromagnetic shielding layer provided on said insulating layers; and
    a section of said targets extending from said portion of said targets for testing of misregistration of said portion of said targets and said insulating layers of analogous shape.

2. The printed circuit board according to claim 1, wherein said insulating layers are formed as a solder resist.

3. The printed circuit board according to claim 1, wherein said insulating layers are formed by silk printing.

4. A method of inspecting a printed circuit board having a conductive layer for electromagnetic shielding, comprising the steps of:
    forming at least two targets formed as conductive patterns of a same shape on said printed circuit board;
    forming insulating layers larger than said targets and analogous in shape in plan view to a portion of said targets and provided in such a way as to be overlaid on said targets;
    forming an electromagnetic shielding layer on said insulating layers; and
    inspecting the presence/absence of misregistration between said portion of said targets and said insulating layers depending on whether said targets are short-circuited by interconnection of said portion of said targets and said electromagnetic shielding layer.

* * * * *